United States Patent
Ma (10) Patent No.: US 9,530,521 B2
(45) Date of Patent: Dec. 27, 2016

(54) SHIFT REGISTER UNIT, GATE DRIVING CIRCUIT, AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Lei Ma, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 143 days.

(21) Appl. No.: 14/500,053

(22) Filed: Sep. 29, 2014

(65) Prior Publication Data
US 2015/0302936 A1 Oct. 22, 2015

(30) Foreign Application Priority Data
Apr. 21, 2014 (CN) .......................... 2014 1 0160217

(51) Int. Cl.
*G11C 19/00* (2006.01)
*G11C 19/28* (2006.01)
*G11C 19/18* (2006.01)

(52) U.S. Cl.
CPC ............. *G11C 19/28* (2013.01); *G11C 19/184* (2013.01); *G09G 2310/0267* (2013.01); *G09G 2310/0286* (2013.01)

(58) Field of Classification Search
None
See application file for complete search history.

(56) References Cited

U.S. PATENT DOCUMENTS

| 7,102,962 | B2 * | 9/2006 | Suzuki | G04B 19/25366 368/37 |
| 7,317,780 | B2 * | 1/2008 | Lin | G09G 3/3648 326/93 |
| 7,400,698 | B2 * | 7/2008 | Chang | G11C 19/28 377/64 |
| 7,561,656 | B2 * | 7/2009 | Chang | G11C 19/28 377/64 |
| 8,976,922 | B2 * | 3/2015 | Shang | G11C 19/28 377/64 |

(Continued)

*Primary Examiner* — Tuan T Lam
(74) *Attorney, Agent, or Firm* — Nath, Goldberg & Meyer; Joshua B. Goldberg; Christopher Thomas (57) ABSTRACT

The present invention provides a shift register unit, a gate driving circuit and a display device. The shift register unit comprises: an input module for, in response to turn-on level input via the shift register input terminal, providing turn-on level to the first node and providing turn-off level to the second node; a pull-up module for, in response to turn-on level of the first node, providing a clock signal to the shift register output terminal, and also used for, in response to turn-on level output by the shift register output terminal, providing turn-off level to the second node; a reset module for, in response to turn-on level input via the reset signal input terminal, providing the turn-on level to the second node; and a pull-down module for, in response to turn-on level of the second node, providing turn-off level to the shift register output terminal and the first node.

16 Claims, 4 Drawing Sheets

(56) References Cited

U.S. PATENT DOCUMENTS

| | | | |
|---|---|---|---|
| 2007/0086558 A1* | 4/2007 | Wei | G11C 19/28 377/64 |
| 2008/0101529 A1* | 5/2008 | Tobita | G09G 3/3677 377/64 |
| 2008/0219401 A1* | 9/2008 | Tobita | G09G 3/3677 377/79 |
| 2011/0057926 A1* | 3/2011 | Shang | G09G 3/3677 345/213 |
| 2012/0262438 A1* | 10/2012 | Shang | G11C 19/28 345/211 |
| 2014/0321599 A1* | 10/2014 | Cho | G11C 19/28 377/64 |

* cited by examiner

SHIFT REGISTER UNIT, GATE DRIVING CIRCUIT, AND DISPLAY DEVICE

FIELD OF THE INVENTION

The present invention relates to the field of display technology, and in particular to a shift register unit, a gate driving circuit, and a display device.

BACKGROUND OF THE INVENTION

In a traditional display, in general, an external driving chip is used to drive pixels on a display panel to display a picture. However, to reduce the amount of elements and lower manufacturing cost, currently, a technique of manufacturing a structure of a driving circuit directly on a display panel has been gradually adopted, for example, a technique of Gate On Array (GOA). In a display panel adopting a GOA technique, a gate driving circuit comprising multiple stages of shift register units is used to provide scanning signals.

However, a traditional shift register unit generally includes two clock signals opposite in phase, in which a turn-on level occupies a relatively long time, and therefore, a threshold voltage drift may occur in a TFT receiving the clock signals after long hours of operation, thus impacting stability of a shift register unit.

SUMMARY OF THE INVENTION

An object of the present invention is to provide a shift register unit, a gate driving circuit and a display device, which can reduce a probability of generating a threshold voltage drift for a device, thus improving stability of a shift register unit.

To solve the above technical problems, the present invention adopts the technical solutions as below.

An aspect of the present invention provides a shift register unit, comprising:

an input module connected to a shift register input terminal, a first node, a second node and a turn-off level input terminal, the input module being used for, in response to a turn-on level input via the shift register input terminal, providing the turn-on level to the first node, and providing a turn-off level input via the turn-off level input terminal to the second node;

a pull-up module connected to a clock signal input terminal, a shift register output terminal, the first node, the second node and the turn-off level input terminal, the pull-up module being used for, in response to a turn-on level of the first node, providing a clock signal input via the clock signal input terminal to the shift register output terminal, and also used for, in response to a turn-on level output by the shift register output terminal, providing a turn-off level input via the turn-off level input terminal to the second node;

a reset module connected to a reset signal input terminal and the second node, the reset module being used for, in response to a turn-on level input via the reset signal input terminal, providing the turn-on level to the second node; and a pull-down module connected to the turn-off level input terminal, the second node, the first node and the shift register output terminal, the pull-down module being used for, in response to a turn-on level of the second node, providing a turn-off level input via the turn-off level input terminal to the shift register output terminal and the first node.

Preferably, the input module comprises a first switch tube and a second switch tube, a gate and a source of the first switch tube are connected to the shift register input terminal, a drain of the first switch tube is connected to the first node, a gate of the second switch tube is connected to the shift register input terminal, a source of the second switch tube is connected to the second node, and a drain of the second switch tube is connected to the turn-off level input terminal.

Preferably, the pull-up module comprises a third switch tube and a fourth switch tube, a gate of the third switch tube is connected to the first node, a source of the third switch tube is connected to the clock signal input terminal, a drain of the third switch tube is connected to the shift register output terminal, a gate of the fourth switch tube is connected to the shift register output terminal, a source of the fourth switch tube is connected to the second node and a drain of the fourth switch tube is connected to the turn-off level input terminal.

Further preferably, the pull-up module further comprises a first capacitor, a first terminal of the first capacitor is connected to the first node, and a second terminal of the first capacitor is connected to the shift register output terminal.

Preferably, the reset module comprises a fifth switch tube, a gate and a source of the fifth switch tube are connected to the reset signal input terminal, and a drain of the fifth switch tube is connected to the second node.

Preferably, the pull-down module comprises a sixth switch tube and a seventh switch tube, a gate of the sixth switch tube is connected to the second node, a source of the sixth switch tube is connected to the shift register output terminal, a drain of the sixth switch tube is connected to the turn-off level input terminal, a gate of the seventh switch tube is connected to the second node, a source of the seventh switch tube is connected to the first node, and a drain of the seventh switch tube is connected to the turn-off level input terminal.

Further preferably, the pull-down module further comprises a second capacitor, a first terminal of the second capacitor is connected to the clock signal input terminal, and a second terminal of the second capacitor is connected to the second node.

Preferably, the pull-down module further comprises an eighth switch tube, a gate of the eighth switch tube is connected to the second node, a source of the eighth switch tube is connected to the first node, and a drain of the eighth switch tube is connected to the turn-off level input terminal.

Preferably, the clock signal input terminal is used for inputting a periodic clock signal, the clock signal in each cycle consists of a turn-on level and a turn-off level, and in each cycle, the turn-on level occupies ¼ of each clock period, and the turn-off level occupies ¾ of each clock period.

Another aspect of the present invention provides a gate driving circuit, comprising n cascaded shift register units, each of which is the shift register unit as described above, and n is an integer larger than 1, wherein, in any two adjacent shift register units, the shift register output terminal of the anterior shift register unit is connected to the shift register input terminal of the posterior shift register unit, and the shift register output terminal of the posterior shift register unit is connected to the reset signal input terminal of the anterior shift register unit.

Another aspect of the present invention provides an array substrate, comprising the above gate driving circuit.

Another aspect of the present invention provides a display device, comprising the above gate driving circuit.

In the shift register unit, the gate driving circuit and the display device provided by the present invention, each shift register unit only includes one clock signal, and it, compared to a traditional shift register unit including two clock signals, reduces time over which a device is at a turn-on level, and lowers a probability of generating a threshold voltage drift for the device, thus improving stability of the shift register unit. In addition, the shift register unit in the embodiments only comprises four control signals, which can reduce wiring space.

BRIEF DESCRIPTION OF THE DRAWINGS

To explain the technical solutions in embodiments of the present invention more clearly, the accompanying drawings used in the embodiments will be briefly introduced below. Apparently, the accompanying drawings described below illustrate merely some embodiments of the present invention, and for those skilled in the art, other drawings can be obtained based on these drawings without creative efforts.

DETAILED DESCRIPTION OF THE EMBODIMENTS

Technical solutions in embodiments of the present invention will be described clearly and completely below in conjunction with the accompanying drawings, and the embodiments to be described are merely a part but not all of the embodiments of the present invention. All other embodiments which, based on the embodiments of the present invention, are obtained by those skilled in the art without creative efforts belong to the protection scope of the present invention.

Figure 1:
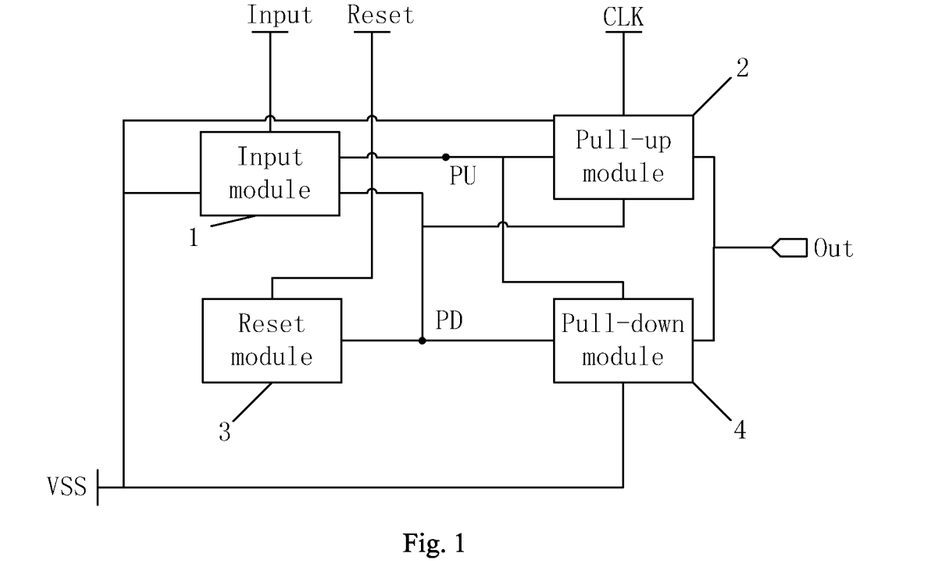
FIG. 1 is a block diagram of a structure of a shift register unit provided by an embodiment of the present invention.

As shown in FIG. 1, the embodiments of the present invention provide a shift register unit, comprising: an input module 1 connected to a shift register input terminal Input, a first node PU, a second node PD and a turn-off level input terminal VSS, the input module 1 being used for, in response to a turn-on level (that is, a shift register input signal) input via the shift register input terminal Input, providing the turn-on level input via the shift register input terminal Input to the first node PU, and providing a turn-off level input via the turn-off level input terminal VSS to the second node PD; a pull-up module 2 connected to a clock signal input terminal CLK, a shift register output terminal Out, the first node PU, the second node PD and the turn-off level input terminal VSS, the pull-up module 2 being used for, in response to a turn-on level of the first node PU, providing a clock signal input via the clock signal input terminal CLK to the shift register output terminal Out, and also used for, in response to a turn-on level output via the shift register output terminal Out, providing a turn-off level input via the turn-off level input terminal VSS to the second node PD; a reset module 3 connected to a reset signal input terminal Reset and the second node PD, the reset module 3 being used for, in response to a turn-on level (that is, a reset signal) input via the reset signal input terminal Reset, providing the turn-on level input via the reset signal input terminal Reset to the second node PU; and a pull-down module 4 connected to the turn-off level input terminal VSS, the second node PD, the first node PU and the shift register output terminal Out, the pull-down module 4 being used for, in response to a turn-on level of the second node PD, providing a turn-off level input via the turn-off level input terminal VSS to the shift register output terminal Out and the first node PU.

Figure 2:
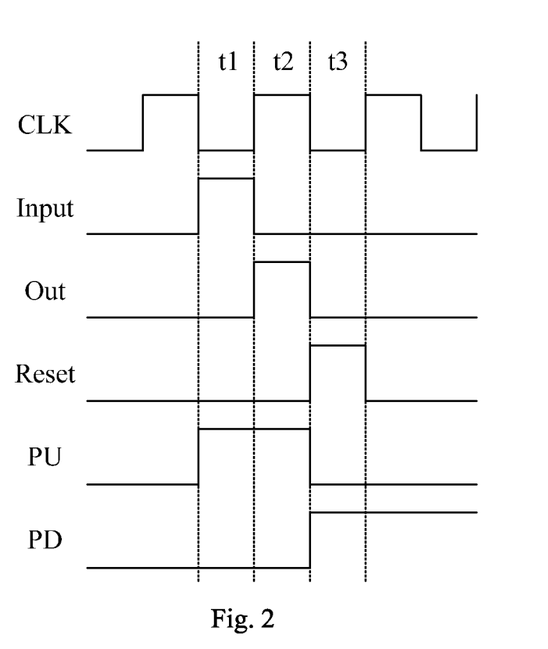
FIG. 2 is a schematic signal timing diagram of the shift register unit in FIG. 1.

As shown in FIG. 2, a turn-off level is always input via the turn-off level input terminal VSS (not shown), a periodic clock signal is input via the clock signal input terminal CLK, and working principle of the shift register unit in FIG. 1 may mainly be described in detail in the following three time periods: a first time period t1 in which a turn-off level is input via the clock signal input terminal CLK, a second time period t2 in which a turn-on level is input via the clock signal input terminal CLK, and a third time period t3 in which a turn-off level is input via the clock signal input terminal CLK. The shift register unit completes a shift of an input signal in the three time periods. Specifically, in the first time period t1, a turn-on level (that is, a shift register input signal) is input via the shift register input terminal Input, in this case, the input module 1 provides said turn-on level to the first node PU and said turn-on level is stored, the pull-up module 2 provides a turn-off level input via the clock signal input terminal CLK to the shift register output terminal Out, and the shift register output terminal Out outputs a turn-off level; in the second time period t2, since the first node PU is still at a turn-on level, the pull-up module 2 provides a turn-on level input via the clock signal input terminal CLK to the shift register output terminal Out, and the shift register output terminal Out outputs a turn-on level; in the third time period t3, a turn-on level (that is, a reset signal) is input via the reset signal input terminal Reset, the reset module 3 provides said turn-on level (that is, the reset signal) to the second node PD, the first node PU is changed to be at a turn-off level, the pull-down module 4 provides the turn-off level input via the turn-off level input terminal VSS to the shift register output terminal Out, and the shift register output terminal Out outputs a turn-off level; afterwards, until a turn-on level is input via the shift register input terminal Input again, the second node PD maintains at a turn-on level, which ensures that the shift register output terminal Out outputs a turn-off level, thus reducing output signal noise effectively.

Figure 3:
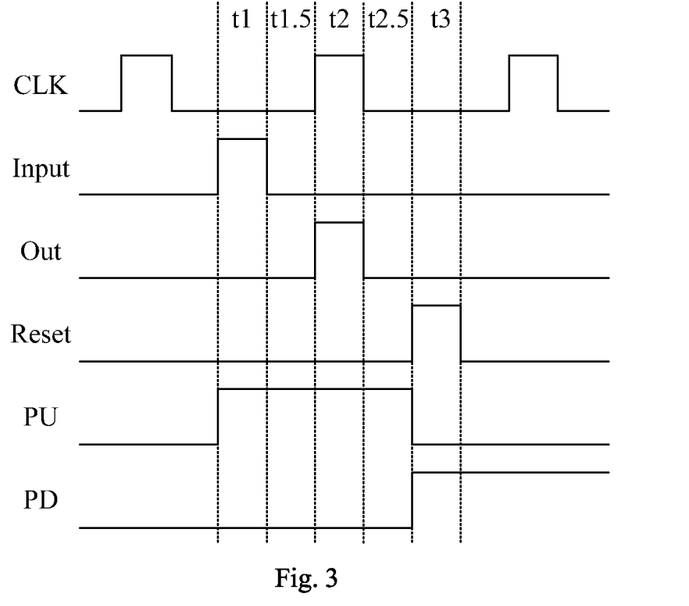
FIG. 3 is another schematic signal timing diagram of the shift register unit in FIG. 1.

As shown in FIG. 3, according to different requirements on charging time of pixel electrodes in a display device, in addition to the three time periods shown in FIG. 2, the main working time of the circuit in FIG. 1 may also comprise a first time interval t1.5 between the first time period t1 and the second time period t2, and a second time interval t2.5 between the second time period t2 and the third time period t3. In the first, second and third time periods t1, t2 and t3, the statuses of the respective signals and the working process of the shift register unit are the same as those described above with reference to FIG. 2. Only the working process of the shift register unit in the first time interval t1.5 and the second time interval t2.5 is described below. In the first time interval t1.5, turn-off levels are input via both the shift register input terminal Input and the clock signal input terminal CLK, at this point, the first node PU maintains at a turn-on level, the pull-up module 2 provides the turn-off level input via the clock signal input terminal CLK to the shift register output terminal Out, and the shift register output terminal Out outputs a turn-off level; in the second time interval t2.5, turn-off levels are input via all of the shift register input terminal Input, the clock signal input terminal CLK and the reset signal input terminal Reset, at this point, the first node PU is at a turn-on level, the pull-up module 2 provides the turn-off level input via the clock signal input terminal CLK to the shift register output terminal Out, and the shift register output terminal Out outputs a turn-off level. The working process of the shift register is substantially unchanged after addition of the two time intervals, except that a time interval between an input signal and an output signal is increased.

The shift register unit provided by this embodiment only includes one clock signal, and it, compared to a traditional shift register unit including two clock signals, reduces time over which a device is at a turn-on level, and lowers a probability of generating a threshold voltage drift for the device, thus improving stability of the shift register unit. In addition, the shift register unit in this embodiment comprises only four control signals (that is, signals input via the turn-off level input terminal VSS, the clock signal input terminal CLK, the shift register input terminal Input and the reset signal input terminal Reset, respectively), which can reduce wiring space.

Figure 4:
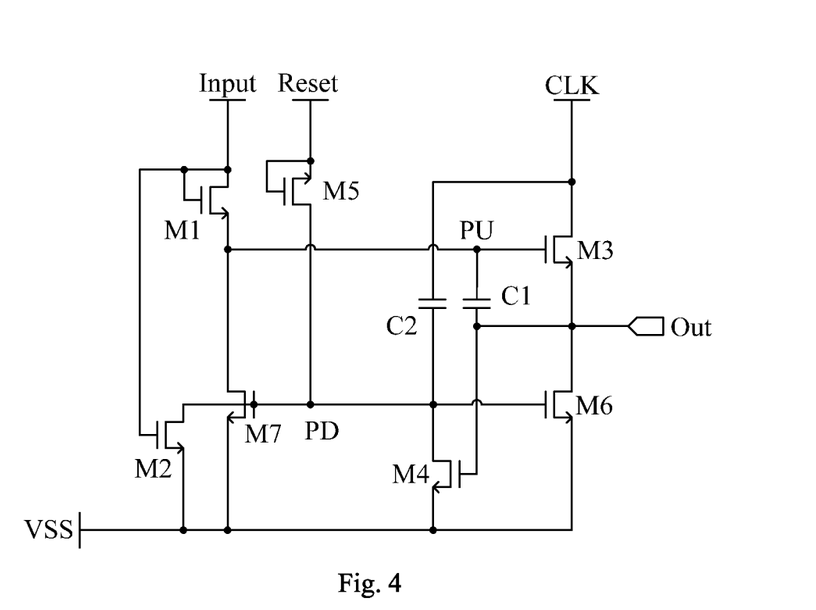
FIG. 4 is a schematic diagram of a circuit structure of a shift register unit provided by an embodiment of the present invention.

Specifically, as shown in FIG. 4, the above input module 1 comprises a first switch tube M1 and a second switch tube M2, a gate and a source of the first switch tube M1 are connected to the shift register input terminal Input, a drain of the first switch tube M1 is connected to the first node PU, a gate of the second switch tube M2 is connected to the shift register input terminal Input, a source of the second switch tube M2 is connected to the second node PD, and a drain of the second switch tube M2 is connected to the turn-off level input terminal VSS; the above pull-up module 2 comprises a third switch tube M3 and a fourth switch tube M4, a gate of the third switch tube M3 is connected to the first node PU, a source of the third switch tube M3 is connected to the clock signal input terminal CLK, a drain of the third switch tube M3 is connected to the shift register output terminal Out, a gate of the fourth switch tube M4 is connected to the shift register output terminal Out, a source of the fourth switch tube M4 is connected to the second node PD and a drain of the fourth switch tube M4 is connected to the turn-off level input terminal VSS; the above reset module 3 comprises a fifth switch tube M5, a gate and a source of the fifth switch tube M5 are connected to the reset signal input terminal Reset, a drain of the fifth switch tube M5 is connected to the second node PD; the above pull-down module 4 comprises a sixth switch tube M6 and a seventh switch tube M7, a gate of the sixth switch tube T6 is connected to the second node PD, a source of the sixth switch tube M6 is connected to the shift register output terminal Out, a drain of the sixth switch tube M6 is connected to the turn-off level input terminal VSS, a gate of the seventh switch tube M7 is connected to the second node PD, a source of the seventh switch tube M7 is connected to the first node PU, and a drain of the seventh switch tube M7 is connected to the turn-off level input terminal VSS.

In addition, the above pull-up module 2 further comprises a first capacitor C1, a first terminal of the first capacitor C1 is connected to the first node PU, and a second terminal of the first capacitor C1 is connected to the shift register output terminal Out. The above pull-down module 4 further comprises a second capacitor C2, a first terminal of the second capacitor C2 is connected to the clock signal input terminal CLK, and a second terminal of the second capacitor C2 is connected to the second node PD. The second capacitor C2 is used for keeping the second node PD at a turn-on level after the reset (i.e. after the third time period t3), and further enabling the shift register output terminal Out to stably output a turn-off level.

It should be noted that the schematic digital timing diagrams shown in FIGS. 2 and 3 are not timing diagrams corresponding to the specific circuit, and do not denote specific magnitudes of voltages at the respective input terminals, nodes and output terminals, but only denote states (a turn-on state or a turn-off state) of the respective input terminals, nodes and output terminals at different time.

Figure 5:
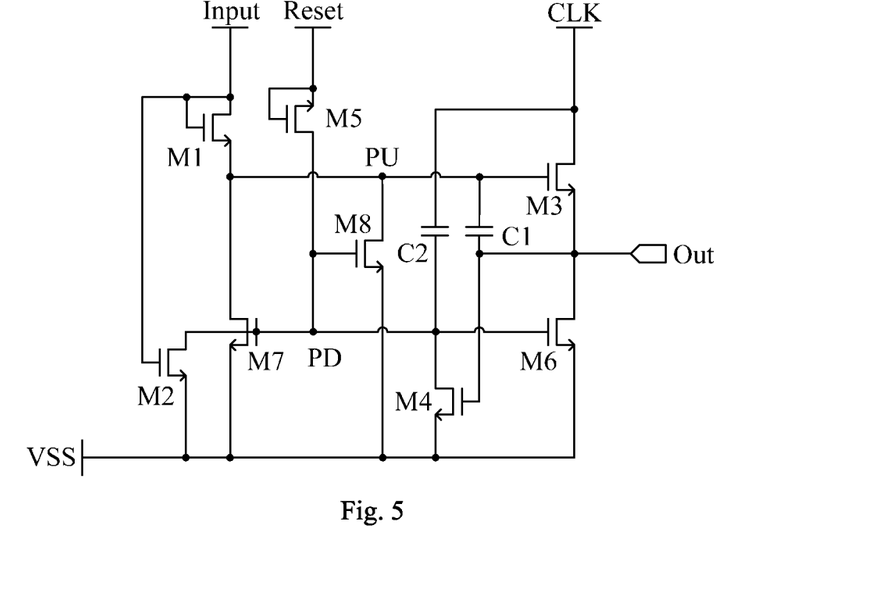
FIG. 5 is a schematic diagram of another circuit structure of a shift register unit provided by an embodiment of the present invention.

As shown in FIG. 5, the above pull-down module 4 may further comprise an eighth switch tube M8, a gate of the eighth switch tube M8 is connected to the second node PD, a source of the eighth switch tube M8 is connected to the first node PU, and a drain of the eighth switch tube M8 is connected to the turn-off level input terminal VSS. The eighth switch tube M8 and the seventh switch tube M7 are connected in the same manner and have the same functional mechanism, and using two switch tubes can enhance pull-down effect of the level at the first node PU.

It should be noted that all of the above first to eighth switch tubes M1 to M8 are P-type or N-type thin film transistors. The source and drain of each of the switch tubes may be exchanged. When all of the above first to eighth switch tubes M1 to M8 are N-type thin film transistors, a turn-on level is a high level, and a turn-off level is a low level; when all of the above first to eighth switch tubes M1 to M8 are P-type thin film transistors, a turn-on level is a low level, and a turn-off level is a high level.

The above clock signal input terminal CLK is used for inputting a periodic clock signal, the clock signal in each cycle consists of a turn-on level and a turn-off level, and in each cycle, preferably, the turn-on level occupies ¼ of each clock period, and the turn-off level occupies ¾ of each clock period. Since the shift register unit provided by the embodiment only includes one clock signal, and compared to a traditional shift register unit including two clock signals, it is unnecessary to set two specific clock signals to cooperate, and the setting of the clock signal may be more diversified. For example, in each cycle, the turn-on level only occupies ¼ of each clock period, which further reduces time over which the switch tube connected to the clock signal input terminal is at a turn-on level, and lowers a probability of generating a threshold voltage drift for the device, thus improving stability of the shift register unit.

By taking the working process of the shift register unit shown in FIG. 4 as an example, the working principle of the shift register unit in the embodiment of the present invention is described below.

Figure 6:
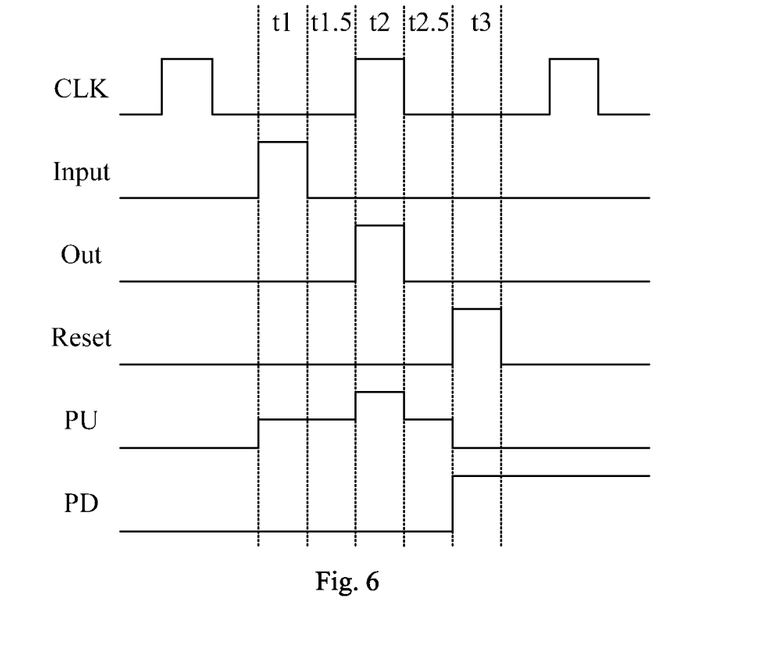
FIG. 6 is a signal timing diagram of the shift register unit in FIG. 4 or FIG. 5.

As shown in FIG. 6, in the first time period t1, turn-off levels are input via the clock signal input terminal CLK and the reset signal input terminal Reset, a turn-on level is input via the shift register input terminal Input, at this point, the first and second switch tubes M1 and M2 are turned on, the first switch tube M1 provides the turn-on level input via the shift register input terminal Input to the first node PU, the third switch tube M3 is thus turned on, the third switch tube M3 then provides the turn-off level input via the clock signal input terminal CLK to the shift register output terminal Out, the fourth switch tube M4 is thus turned off, the second switch tube M2 provides the turn-off level input via the turn-off level input terminal VSS to the second node PD, and the sixth and seventh switch tubes M6 and M7 are thus turned off; in the first time interval t1.5, turn-off levels are input via the clock signal input terminal CLK, the shift register input terminal Input and the reset signal input terminal Reset, the first node PU maintains at a turn-on level due to the first capacitor C1, the third switch tube M3 provides the turn-off level input via the clock signal input terminal CLK to the shift register output terminal Out, the fourth switch tube T4 is thus turned off, the second node PD maintains at a turn-off level, and thus the sixth and seventh switch tubes M6 and M7 are still turned off; in the second time period t2, a turn-on level is input via the clock signal input terminal CLK, turn-off levels are input via the shift register input terminal Input and the reset signal input terminal Reset, the first node PU is still at a turn-on level, the third switch tube M3 provides the turn-on level input via the clock signal input terminal CLK to the shift register output terminal Out, thus the fourth switch tube T4 is turned-on and provides a turn-off level input via the turn-off level input terminal VSS to the second node PD, the voltage at the terminal of the first capacitor C1 connected to the shift register output terminal Out is changed to a turn-on level from a turn-off level, the level at the first node PU is further increased due to the bootstrap function of the first capacitor C1, so as to ensure the pull-up effect on the level of the shift register output terminal Out, and since the second node PD is at a turn-off level, the sixth and seventh switch tubes M6 and M7 are still turned off; in the second time interval t2.5, turn-off levels are input via the clock signal input terminal CLK, the shift register input terminal Input and the reset signal input terminal Reset, the first node PU is still at a turn-on level, the third switch tube M3 provides the turn-off level input via the clock signal input terminal CLK to the shift register output terminal Out, the fourth switch tube T4 is thus turned off, the second node PD is still at a turn-off level, and the sixth and seventh switch tubes M6 and M7 are thus turned off; in the third time period t3, turn-off levels are input via the clock signal input terminal CLK and the shift register input terminal Input, a turn-on level is input via the reset signal input terminal Reset, the fifth switch tube T5 is thus turned on and provides the turn-on level input via the reset signal input terminal Reset to the second node PD, the sixth and seventh switch tubes M6 and M7 are thus turned on, the sixth switch tube M6 provides the turn-off level input via the turn-off level input terminal VSS to the shift register output terminal Out, the seventh switch tube M7 provides the turn-off level input via the turn-off level input terminal VSS to the first node PU, and thus the third switch tube M3 is turned off; afterwards, until a turn-on level is input via the shift register input terminal Input again, the second node PD maintains at a turn-on level due to the capacitor C2, which ensures that the shift register output terminal Out outputs a turn-off level, thus reducing output signal noise effectively.

The shift register unit provided by this embodiment only includes one clock signal, and it, compared to a traditional shift register unit including two clock signals, reduces time over which a device is at a turn-on level, and lowers a probability of generating a threshold voltage drift for the device, thus improving stability of the shift register unit. In addition, the shift register unit in this embodiment only comprises four control signals, which can reduce wiring space.

Figure 7:
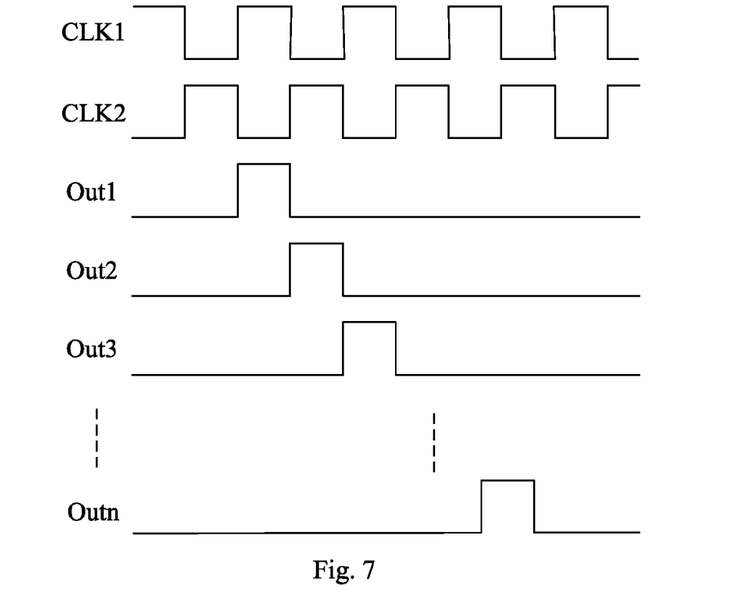
FIG. 7 is a signal timing diagram of a gate driving circuit provided by an embodiment of the present invention.
Figure 8:
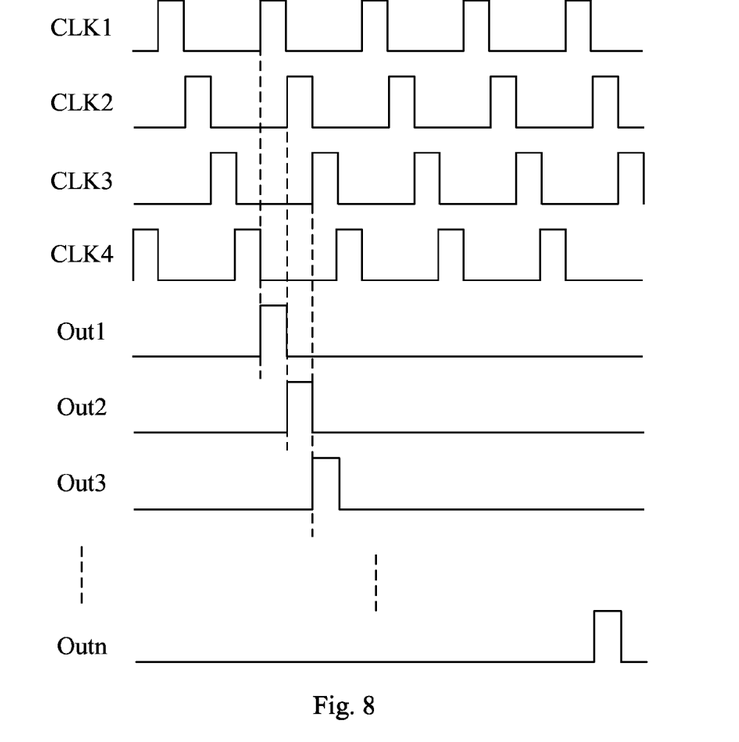
FIG. 8 is another signal timing diagram of a gate driving circuit provided by an embodiment of the present invention.

Embodiments of the present invention further provide a gate driving circuit, comprising n cascaded shift register units, each of which is the shift register unit as described above, and n is an integer larger than 1, wherein, in any two adjacent shift register units, the shift register output terminal of the anterior shift register unit is connected to the shift register input terminal of the posterior shift register unit, and the shift register output terminal of the posterior shift register unit is connected to the reset signal input terminal of the anterior shift register unit. In addition, since it is necessary to ensure that each shift register unit operate with a corresponding clock signal so as to achieve shift of an input signal when receiving the input signal, clock signal input terminals of two adjacent shift register units need to receive different clock signals. For example, as shown in FIG. 7, output terminals of n cascaded shift register units are Out1, Out2, Out3, . . . , Outn, successively, the clock signal input terminals of the odd-numbered shift register units are CLK1, the clock signal input terminals of the even-numbered shift register units are CLK2, and complementary clock signals are input via the clock signal input terminals CLK1 and CLK2, respectively. As another example, as shown in FIG. 8, the output terminals of n cascaded shift register units are Out1, Out2, Out3, . . . , Outn, successively, every four adjacent shift register units form one shift register unit group, the clock signal input terminals of the four shift register units in each shift register unit group are CLK1, CLK2, CLK3 and CLK4, successively, different clock signals as shown in FIG. 8 are input via the four clock signal input terminals. Of course, clock signals input via the clock signal input terminals of the respective shift register units may have other combination modes, as long as each shift register unit can work normally, and the specific implementations are not elaborated herein.

In the gate driving circuit provided by this embodiment, each shift register unit only includes one clock signal, and it, compared to a traditional shift register unit including two clock signals, reduces time over which a device is at a turn-on level, and lowers a probability of generating a threshold voltage drift for the device, thus improving stability of the shift register unit. In addition, the shift register unit in this embodiment only comprises four control signals, which can reduce wiring space.

Embodiments of the present invention further provide an array substrate, comprising the above gate driving circuit. Embodiments of the present invention further provide a display device, comprising the above gate driving circuit. The display device may be any product or component with a display function, such as a liquid crystal panel, electronic paper, an OLED panel, a mobile phone, a tablet computer, a television, a display, a notebook computer, a digital photo frame, a navigator or the like.

In the array substrate and the display device provided by this embodiment, each shift register unit only includes one clock signal, and it, compared to a traditional shift register unit including two clock signals, reduces time over which a device is at a turn-on level, and lowers a probability of generating a threshold voltage drift for the device, thus improving stability of the shift register unit. In addition, the shift register unit in this embodiment only comprises four control signals, which can reduce a space for wiring.

The above described implementations are merely specific implementations of the present invention, but the protection scope of the present invention is not limited thereto. Alternations and substitutions which, within the technical scope disclosed by the present invention, can be easily envisaged by those skilled in the art should be covered by the protection scope of the present invention. Therefore, the protection scope of the present invention is subject to the protection scope defined by the claims.

The invention claimed is:
1. A shift register unit, comprising:
    an input module connected to a shift register input terminal, a first node, a second node and a turn-off level input terminal, the input module being used for, in response to a turn-on level input via the shift register input terminal, providing the turn-on level to the first node, and providing a turn-off level input via the turn-off level input terminal to the second node;

a pull-up module connected to a clock signal input terminal, a shift register output terminal, the first node, the second node and the turn-off level input terminal, the pull-up module being used for, in response to a turn-on level of the first node, providing a clock signal input via the clock signal input terminal to the shift register output terminal, and also used for, in response to a turn-on level output by the shift register output terminal, providing a turn-off level input via the turn-off level input terminal to the second node;

a reset module connected to a reset signal input terminal and the second node, the reset module being used for, in response to a turn-on level input via the reset signal input terminal, providing the turn-on level to the second node;

a pull-down module connected to the turn-off level input terminal, the second node, the first node and the shift register output terminal, the pull-down module being used for, in response to a turn-on level of the second node, providing a turn-off level input via the turn-off level input terminal to the shift register output terminal and the first node, wherein the pull-down module comprises a second capacitor, a first terminal of the second capacitor is connected to the clock signal input terminal, and a second terminal of the second capacitor is connected to the second node.

2. The shift register unit according to claim 1, wherein the input module comprises a first switch tube and a second switch tube, a gate and a source of the first switch tube are connected to the shift register input terminal, a drain of the first switch tube is connected to the first node, a gate of the second switch tube is connected to the shift register input terminal, a source of the second switch tube is connected to the second node, and a drain of the second switch tube is connected to the turn-off level input terminal.

3. The shift register unit according to claim 1, wherein the pull-up module comprises a third switch tube and a fourth switch tube, a gate of the third switch tube is connected to the first node, a source of the third switch tube is connected to the clock signal input terminal, a drain of the third switch tube is connected to the shift register output terminal, a gate of the fourth switch tube is connected to the shift register output terminal, a source of the fourth switch tube is connected to the second node and a drain of the fourth switch tube is connected to the turn-off level input terminal.

4. The shift register unit according to claim 2, wherein the pull-up module comprises a third switch tube and a fourth switch tube, a gate of the third switch tube is connected to the first node, a source of the third switch tube is connected to the clock signal input terminal, a drain of the third switch tube is connected to the shift register output terminal, a gate of the fourth switch tube is connected to the shift register output terminal, a source of the fourth switch tube is connected to the second node and a drain of the fourth switch tube is connected to the turn-off level input terminal.

5. The shift register unit according to claim 3, wherein the pull-up module further comprises a first capacitor, a first terminal of the first capacitor is connected to the first node, and a second terminal of the first capacitor is connected to the shift register output terminal.

6. The shift register unit according to claim 4, wherein the pull-up module further comprises a first capacitor, a first terminal of the first capacitor is connected to the first node, and a second terminal of the first capacitor is connected to the shift register output terminal.

7. The shift register unit according to claim 1, wherein the reset module comprises a fifth switch tube, a gate and a source of the fifth switch tube are connected to the reset signal input terminal, and a drain of the fifth switch tube is connected to the second node.

8. The shift register unit according to claim 6, wherein the reset module comprises a fifth switch tube, a gate and a source of the fifth switch tube are connected to the reset signal input terminal, and a drain of the fifth switch tube is connected to the second node.

9. The shift register unit according to claim 1, wherein the pull-down module comprises a sixth switch tube and a seventh switch tube, a gate of the sixth switch tube is connected to the second node, a source of the sixth switch tube is connected to the shift register output terminal, a drain of the sixth switch tube is connected to the turn-off level input terminal, a gate of the seventh switch tube is connected to the second node, a source of the seventh switch tube is connected to the first node, and a drain of the seventh switch tube is connected to the turn-off level input terminal.

10. The shift register unit according to claim 8, wherein the pull-down module comprises a sixth switch tube and a seventh switch tube, a gate of the sixth switch tube is connected to the second node, a source of the sixth switch tube is connected to the shift register output terminal, a drain of the sixth switch tube is connected to the turn-off level input terminal, a gate of the seventh switch tube is connected to the second node, a source of the seventh switch tube is connected to the first node, and a drain of the seventh switch tube is connected to the turn-off level input terminal.

11. The shift register unit according to claim 9, wherein the pull-down module further comprises an eighth switch tube, a gate of the eighth switch tube is connected to the second node, a source of the eighth switch tube is connected to the first node, and a drain of the eighth switch tube is connected to the turn-off level input terminal.

12. The shift register unit according to claim 10, wherein the pull-down module further comprises an eighth switch tube, a gate of the eighth switch tube is connected to the second node, a source of the eighth switch tube is connected to the first node, and a drain of the eighth switch tube is connected to the turn-off level input terminal.

13. The shift register unit according to claim 1, wherein the clock signal input terminal is used for inputting a periodic clock signal, the clock signal in each cycle consists of a turn-on level and a turn-off level, and in each cycle, the turn-on level occupies ¼ of each clock period, and the turn-off level occupies ¾ of each clock period.

14. The shift register unit according to claim 11, wherein the clock signal input terminal is used for inputting a periodic clock signal, the clock signal in each cycle consists of a turn-on level and a turn-off level, and in each cycle, the turn-on level occupies ¼ of each clock period, and the turn-off level occupies ¾ of each clock period.

15. A gate driving circuit, comprising n cascaded shift register units, each of which is the shift register unit according to claim 1, and n is an integer larger than 1, wherein, in any two adjacent shift register units, the shift register output terminal of a previous shift register unit is connected to the shift register input terminal of a next shift register unit, and the shift register output terminal of the next shift register unit is connected to the reset signal input terminal of the anterior shift register unit.

16. A display device, comprising the gate driving circuit according to claim 15.

* * * * *